(12) United States Patent
Imamura et al.

(10) Patent No.: US 9,457,407 B2
(45) Date of Patent: Oct. 4, 2016

(54) SURFACE-COATED CUTTING TOOL

(71) Applicant: SUMITOMO ELECTRIC HARDMETAL CORP., Itami-shi (JP)

(72) Inventors: Shinya Imamura, Itami (JP); Takahiro Ichikawa, Itami (JP); Susumu Okuno, Itami (JP); Hideaki Kanaoka, Itami (JP); Keiichi Tsuda, Itami (JP)

(73) Assignee: SUMITOMO ELECTRIC HARDMETAL CORP., Itami-shi (JP)

( * ) Notice: Subject to any disclaimer, the term of this patent is extended or adjusted under 35 U.S.C. 154(b) by 46 days.

(21) Appl. No.: 14/389,282

(22) PCT Filed: Apr. 11, 2013

(86) PCT No.: PCT/JP2013/060912
§ 371 (c)(1),
(2) Date: Sep. 29, 2014

(87) PCT Pub. No.: WO2013/157472
PCT Pub. Date: Oct. 24, 2013

(65) Prior Publication Data
US 2015/0064453 A1 Mar. 5, 2015

(30) Foreign Application Priority Data

Apr. 19, 2012 (JP) ................................ 2012-095631
Apr. 19, 2012 (JP) ................................ 2012-095632

(51) Int. Cl.
| | | |
|---|---|---|
| C23C 16/34 | (2006.01) | |
| B23B 27/14 | (2006.01) | |
| C23C 14/06 | (2006.01) | |
| C23C 14/32 | (2006.01) | |
| C23C 16/36 | (2006.01) | |
| B23C 5/16 | (2006.01) | |
| C23C 16/40 | (2006.01) | |
| C23C 28/04 | (2006.01) | |

(52) U.S. Cl.
CPC ................. *B23B 27/14* (2013.01); *B23C 5/16* (2013.01); *C23C 14/0641* (2013.01); *C23C 14/0658* (2013.01); *C23C 14/0664* (2013.01); *C23C 14/325* (2013.01); *C23C 16/34* (2013.01); *C23C 16/36* (2013.01); *C23C 16/403* (2013.01); *C23C 28/042* (2013.01); *C23C 28/044* (2013.01); *C23C 28/048* (2013.01); *B23B 2222/28* (2013.01); *B23B 2224/32* (2013.01); *B23B 2224/36* (2013.01); *B23C 2222/28* (2013.01); *B23C 2224/32* (2013.01); *B23C 2224/36* (2013.01); *Y10T 428/265* (2015.01); *Y10T 428/31678* (2015.04)

(58) Field of Classification Search
USPC .......... 51/307, 309; 428/336, 698, 699, 701, 428/702
See application file for complete search history.

(56) References Cited

U.S. PATENT DOCUMENTS

| | | | |
|---|---|---|---|
| 5,232,318 A | 8/1993 | Santhanam et al. | |
| 5,652,045 A | 7/1997 | Nakamura et al. | |
| 5,942,318 A * | 8/1999 | Soderberg | ............... C23C 16/36 |
| | | | 428/336 |
| 5,958,569 A | 9/1999 | Leverenz et al. | |
| 6,338,894 B1 * | 1/2002 | Hirakawa | ............. C23C 16/029 |
| | | | 428/698 |
| 2005/0042482 A1 | 2/2005 | Okada et al. | |
| 2007/0172675 A1 | 7/2007 | Omori et al. | |
| 2008/0057280 A1 | 3/2008 | Watanabe et al. | |
| 2010/0098911 A1 | 4/2010 | Tanibuchi et al. | |
| 2011/0002749 A1 | 1/2011 | Ljungberg et al. | |
| 2013/0152481 A1 | 6/2013 | Paseuth et al. | |

FOREIGN PATENT DOCUMENTS

| | | |
|---|---|---|
| CN | 1202845 A | 12/1998 |
| CN | 1620349 A | 5/2005 |
| CN | 101941085 A | 1/2011 |
| JP | 05-237707 A | 9/1993 |
| JP | 08-118105 A | 5/1996 |
| JP | 2000-158205 * | 6/2000 |
| JP | 2001-322008 * | 11/2001 |
| JP | 2002-331403 A | 11/2002 |
| JP | 2005-153098 A | 6/2005 |
| JP | 2010-076029 A | 4/2010 |
| JP | 2011-011331 A | 1/2011 |
| WO | WO-2012/032839 A1 | 3/2012 |

OTHER PUBLICATIONS

Kazuhiro Akiyama et al., "A study of the adhesion between CVD layers and a cemented carbide substrate by AEM analysis," Surface and Coatings Technology, 1997, vol. 94-95, pp. 328-332.
International Search Report in PCT International Application No. PCT/JP2013/060912, dated Jun. 11, 2013.
Notification of the First Office Action in Chinese Patent Application No. 2013800206366, dated Oct. 10, 2015.
Extended European Search Report in European Patent Application No. 13777839.5, dated Jan. 7, 2016.

* cited by examiner

Primary Examiner — Archene Turner
(74) Attorney, Agent, or Firm — Venable LLP; Michael A. Sartori; David M. Klecyngier

(57) ABSTRACT

A surface-coated cutting tool of the present invention includes a base material and a coating formed on the base material, the coating includes one or two or more layers, a layer among these layers that abuts on the base material is a TiN layer, the TiN layer contains at least one element together with TiN, the element has a concentration distribution in a thickness direction of the TiN layer, and the concentration distribution includes a region where the concentration of the element decreases in a direction from the base material toward a surface of the coating.

18 Claims, No Drawings

SURFACE-COATED CUTTING TOOL

TECHNICAL FIELD

The present invention relates to a surface-coated cutting tool having a base material and a coating formed on the base material.

BACKGROUND ART

The recent trends of cutting work include the demand for dry work dispensing with a cutting oil agent from the standpoint of global environmental protection, the increasing variety of workpieces to be cut, and the increasing cutting speed with the aim of further improving the work efficiency, for example. Accordingly, the cutting tool used for cutting work tends to have a higher temperature of its cutting edge during cutting work, and characteristics required of the tool material are becoming increasingly severer.

In particular, a coating (also called ceramic coating or hard layer for example) formed on the surface of the tool is a significantly important factor for meeting such requirements for characteristics of the tool material. The required characteristics of such a coating include, in addition to high hardness (wear resistance) and high-temperature stability (oxidation resistance), strong adherence to the base material.

In order to improve the adherence of the coating to the base material, Japanese Patent Laying-Open No. 05-237707 (PTD 1) proposes to form a plurality of coatings on a base material made of a cemented carbide and diffuse W and Co in the first coating. Japanese Patent Laying-Open No. 2002-331403 (PTD 2) proposes to form projections on the surface of a base material and segregate a coating on grain boundaries of the projections, thereby achieving an anchor effect.

CITATION LIST

Patent Document

PTD 1: Japanese Patent Laying-Open No. 05-237707
PTD 2: Japanese Patent Laying-Open No. 2002-331403

SUMMARY OF INVENTION

Technical Problem

According to PTD 1, the coating temperature for the first coating is a low temperature of 700 to 800° C. It had therefore been impossible to sufficiently improve the adherence between the base material and the coatings. According to PTD 2, the coating unevenly grows along the projections on the surface of the base material, and non-uniform crystal growth results in problems of lower wear resistance and strength.

The present invention has been made in view of the current circumstances as described above, and an object of the invention is to provide a surface-coated cutting tool excellent in adherence between the base material and the coating.

Solution to Problem

The inventors of the present invention have conducted thorough studies in order to solve the above problems to consequently find that the adherence will further be improved by arranging a TiN layer, which is known as excellent in adherence to the base material, as the lowermost layer of the coating, namely arranging it at the position abutting on the base material, and diffusing components constituting the base material in the TiN layer, and have conducted further studies based on this finding to thereby complete the present invention.

Specifically, a surface-coated cutting tool of the present invention includes a base material and a coating formed on the base material, the coating includes one or two or more layers, a layer among these layers that abuts on the base material is a TiN layer, the TiN layer contains at least one element together with TiN, the element has a concentration distribution in a thickness direction of the TiN layer, and the concentration distribution includes a region where the concentration of the element decreases in a direction from the base material toward a surface of the coating.

The surface-coated cutting tool of the present invention chiefly includes the following two aspects: first aspect and second aspect. The second aspect may also be considered as a subordinate concept of the first aspect.

Specifically, the surface-coated cutting tool in the first aspect of the present invention includes a base material and a coating formed on the base material, the coating includes one or two or more layers, a layer among these layers that abuts on the base material is a TiN layer, the TiN layer contains C together with TiN, the C has a concentration distribution in the thickness direction of the TiN layer, the concentration distribution includes a region where the concentration of the C decreases in the direction from the base material toward the surface of the coating.

Preferably the concentration distribution has a difference between a maximum concentration and a minimum concentration of the C of 10 atomic %, and preferably the C has a maximum concentration of 30 atomic % or less.

Preferably the concentration distribution has a distribution where the concentration of the C decreases in the direction from the base material, then reaches a local minimum, and thereafter increases in the direction toward the surface of the coating, and preferably the TiN layer has a thickness of 0.1 to 0.5 µm.

Preferably the coating includes a TiCN layer located directly on the TiN layer, the TiCN layer contains TiCN, and C in the TiCN layer has a maximum concentration of 20 atomic % or more.

Preferably the coating further includes another layer, and this another layer is one or more layers made of a compound of at least one element selected from the group consisting of group 4 elements (such as Ti, Zr, Hf), group 5 elements (such as V, Nb, Ta), and group 6 elements (such as Cr, Mo, W) in the periodic table, Al, and Si and at least one element selected from the group consisting of boron, carbon, nitrogen, and oxygen.

Preferably the coating is formed by chemical vapor deposition, and preferably the base material is a cemented carbide.

The surface-coated cutting tool in the second aspect of the present invention includes a base material and a coating formed on the base material, the base material is made of a cemented carbide, the coating includes one or two or more layers, a layer among these layers that abuts on the base material is a TiN layer, the TiN layer contains C and Co together with TiN, the C and the Co each have a concentration distribution in the thickness direction of the TiN layer, the concentration distribution of the C includes a region where the concentration of the C decreases in the direction from the base material toward the surface of the coating, and the concentration distribution of the Co includes a region where the concentration of the Co decreases in the direction from the base material toward the surface of the coating.

Preferably the C and the Co in the TiN layer have an atomic ratio that the C is twice or more as high as the Co, and preferably the concentration distribution of the C has a difference between a maximum concentration and a minimum concentration of the C of 10 atomic % or more.

Preferably the C has a maximum concentration of 30 atomic % or less, and the Co has a maximum concentration of 5 atomic % or less. Preferably the concentration distribution of the C has a distribution where the concentration of the C decreases in the direction from the base material, then reaches a local minimum, and thereafter increases in the direction toward the surface of the coating, and the concentration distribution of the Co has a distribution where the concentration of the Co decreases in the direction from the base material toward the surface of the coating.

Preferably the TiN layer has a thickness of 0.1 to 0.5 μm. Preferably the coating includes a TiCN layer located directly on the TiN layer, the TiCN layer contains TiCN, and C in the TiCN layer has a maximum concentration of 20 atomic % or more.

Preferably the coating further includes another layer, and this another layer is one or more layers made of a compound of at least one element selected from the group consisting of group 4 elements (such as Ti, Zr, Hf), group 5 elements (such as V, Nb, Ta), and group 6 elements (such as Cr, Mo, W) in the periodic table, Al, and Si and at least one element selected from the group consisting of boron, carbon, nitrogen, and oxygen. Preferably the coating is formed by chemical vapor deposition.

Advantageous Effects of Invention

The surface-coated cutting tool of the present invention has the above-described characteristics to thereby have a significantly excellent effect that the adherence between the base material and the coating formed on the surface of the base material is excellent. Accordingly, the surface-coated cutting tool of the present invention achieves a long life for cutting work.

DESCRIPTION OF EMBODIMENTS

The present invention will hereinafter be described in further detail.

<Surface-Coated Cutting Tool>

The surface-coated cutting tool of the present invention has a structure including a base material and a coating formed on the base material. While it is preferable that this coating coats the whole surface of the base material, the coating failing to coat a part of the base material or the coating having a partially different structure does not depart from the scope of the present invention.

Such a surface-coated cutting tool of the present invention can be used suitably as a cutting tool such as drill, end-mill, indexable insert for drilling, indexable insert for end-milling, indexable insert for milling, indexable insert for turning, metal-slitting saw, gear cutting tool, reamer, tap or the like.

In the following, the surface-coated cutting tool of the present invention will be described in further detail separately for the first aspect and the second aspect.

<Surface-Coated Cutting Tool in First Aspect>

<Base Material>

As the base material used for the surface-coated cutting tool in the first aspect of the present invention, any conventionally-known base material of this type may be used as long as it contains carbon. For example, the base material is preferably any one of a cemented carbide (for example, a WC-based cemented carbide, a cemented carbide containing WC and Co, and a cemented carbide containing WC and Co and additionally a carbonitride of Ti, Ta, Nb or the like), a cermet (having a main component such as TiC, TiN, TiCN or the like), a high-speed steel, a ceramic material (such as titanium carbide, silicon carbide, or the like), and a diamond sintered body.

Among these variety of base materials, the cemented carbide is particularly preferred, since C can easily be diffused into the TiN layer.

In the case where the surface-coated cutting tool is an indexable insert or the like, the base material may or may not have a chip breaker, and the edge ridgeline may be shaped into a sharp edge (the ridge where the rake face and the flank face meet each other), shaped to have a honed edge (a sharp edge processed to be rounded (R)), shaped to have a negative land (beveled), or shaped to have a combination of the honed edge and the negative land.

<Coating>

The coating in the first aspect of the present invention is made up of one or two or more layers. Such a coating is generally formed for the purpose of improving various characteristics of the cutting tool such as wear resistance, fracture resistance, and the like, and/or making the used cutting edge identifiable.

The thickness of this coating is not particularly limited, and may for example be 3 to 20 μm, more preferably 4 to 15 μm. For this coating, any of conventionally known methods for forming (methods for depositing) such as physical vapor deposition (PVD) and chemical vapor deposition (CVD) may be used without being particularly limited. Above all, chemical vapor deposition may preferably be used for forming the coating, since use of chemical vapor deposition provides a relatively high deposition temperature of 800 to 1050° C. and superior adherence to the base material as compared with physical vapor deposition and the like.

<TiN Layer>

The coating in the first aspect of the present invention is made up of one or two or more layers as described above. Among the layers, it is a TiN layer that abuts on the base material. The TiN layer has an excellent function of having excellent adherence to any of a variety of base materials.

In the first aspect of the present invention, the TiN layer is characterized in that the TiN layer contains C (carbon) together with TiN, the C has a concentration distribution in the thickness direction of the TiN layer, and the concentration distribution includes a region where the concentration of C decreases in the direction from the base material toward the surface of the coating. The TiN layer has these characteristics to thereby significantly improve the adherence between the base material and the coating.

The reason for the above appears to be the fact that C in the base material diffuses into the TiN layer through the interface between the base material and the TiN layer to thereby improve the adherence between the base material and the TiN layer (coating). While C thus diffused in the TiN layer is a factor which is important from the standpoint of improving the adherence, C also has a contrary function of embrittling the coating. Due to this, the presence of C is not preferable from the standpoint of the strength of the coating. Thus, according to the first aspect of the present invention, a trade-off is made between these functions contrary to each other by providing C so that the C is present with its concentration distribution in the thickness direction of the TiN layer in which the concentration of C is higher as the distance from the base material is smaller and decreases toward the surface of the coating.

Namely, the TiN layer in the first aspect of the present invention is characterized in that the TiN layer contains C together with TiN, this C has a concentration distribution in the thickness direction of the TiN layer, and the concentration distribution includes a region where the concentration of C decreases in the direction from the base material toward the surface of the coating.

Here, in what form C (carbon) is present in the TiN layer is not particularly limited. C is assumed to be present in the form of atomic carbon or in the form of a solid solution of C in TiN. "Includes a region where the concentration of C decreases in the direction from the base material toward the surface of the coating" means that the concentration distribution of C in the thickness direction of the TiN layer may include a portion where the concentration of C decreases in the direction from the base material toward the surface of the coating and, as long as the distribution includes this portion, it may also include a portion where the concentration of C is constant in the thickness direction, a portion where the concentration thereof increases toward the surface of the coating, or a portion without containing C, for example.

Further, the concentration distribution has a difference between a maximum concentration and a minimum concentration of C of preferably 10 atomic % or more C has a maximum concentration of preferably 30 atomic % or less. This is for the reason that if the maximum concentration of C is higher than 30 atomic %, the function of embrittling the coating is stronger than the function of improving the adherence, resulting in lower strength of the coating. If the difference between the maximum concentration and the minimum concentration is less than 10 atomic %, the function of improving the adherence may not sufficiently be performed. While the lower limit of the maximum concentration of C is not particularly limited, the lower limit is preferably 5 atomic % or more from the standpoint of sufficiently performing the function of improving the adherence. Since the maximum concentration of C is preferably 30 atomic % or less as described above, the difference between the maximum concentration and the minimum concentration of C is preferably 15 atomic % or less.

The concentration (atomic %) of C herein refers to the percentage relative to all atoms constituting the TiN layer.

Further, the concentration distribution preferably has a distribution where the concentration of C decreases in the direction from the base material, then reaches a local minimum, and thereafter increases in the direction toward the surface of the coating. This is for the following reason. The presence of the local minimum of the concentration ensures a region where the concentration of C is lower, to thereby suppress embrittlement of the coating due to C. Accordingly the coating is prevented from having decreased strength. In addition, the increase of the concentration of C toward the surface of the coating enables the hardness of the coating to be increased. Namely, this concentration distribution enables both the high strength and the high hardness of the coating to be accomplished.

The concentration of C may be increased toward the surface of the coating by means of a variety of methods. It appears to be easiest and preferable to diffuse C from a layer formed directly on the TiN layer.

This TiN layer in the first aspect of the present invention preferably has a thickness of 0.1 to 0.5 μm (0.1 μm or more and 0.5 μm or less). If the thickness of the TiN layer is less than 0.1 μm, the function of improving the adherence may not sufficiently be exhibited. If the thickness of the TiN layer is more than 0.5 μm, the wear resistance of the coating as a whole may be deteriorated. The TiN layer has a thickness of more preferably 0.2 to 0.4 μm.

In the first aspect of the present invention, the composition of the coating and the concentration of C in the coating can be identified through an EDS (energy dispersive X-ray analyzer) analysis of a cross section of the coating with a transmission electron microscope. The thickness of the coating can be measured through observation of a cross section of the coating with a scanning electron microscope.

<TiCN Layer>

The coating in the first aspect of the present invention preferably includes a TiCN layer located directly on the TiN layer. This TiCN layer contains TiCN. C (carbon) in the TiCN layer preferably has a maximum concentration of 20 atomic % or more. The TiCN layer thus placed directly on the TiN layer allows C to be diffused from the TiCN layer into the TiN layer and thereby improves the adherence between these layers.

C in the TiCN layer has a maximum concentration of preferably 20 atomic % or more, since this is necessary for improving the wear resistance of the TiCN layer. C has a maximum concentration of more preferably 30 atomic % or more, and its upper limit is preferably 60 atomic % or less, because the upper limit higher than 60 atomic % causes embrittlement.

Regarding the first aspect of the present invention, chemical formulas such as "TiN" and "TiCN" for which the atomic ratio is not particularly specified do not mean that the atomic ratio of each element is only "1". Rather, the atomic ratio may be any of all conventionally known atomic ratios. In particular, regarding TiCN in the TiCN layer, the ratio of C may be more than the stoichiometric ratio.

<Another Layer>

The coating in the first aspect of the present invention can further include another layer besides the TiN layer and the TiCN layer as described above. This another layer is formed on the TiCN layer (the TiN layer in the case where the TiCN layer is not formed).

This another layer is preferably one or more layers made of a compound of at least one element selected from the group consisting of group 4 elements, group 5 elements, and group 6 elements in the periodic table, Al, and Si and at least one element selected from the group consisting of boron, carbon, nitrogen, and oxygen. Another layer as described above can be formed to thereby improve various characteristics of the cutting tool such as wear resistance, fracture resistance, and the like, and/or make the used cutting edge identifiable.

Specific examples of the compound of which another layer as described above is made may for example be TiC, $Al_2O_3$, ZrN, TiAlN, TiBN, TiCN, TiN, CrN, ZrCN, AlZrO, HfN, TiSiCN, $ZrO_2$, $TiB_2$, TiAlCN, TiCNO, and $Ti_2O_3$.

The above-listed specific examples of the compound include TiN and TiCN, which means that a TiN layer may also be placed anywhere other than the position directly on the base material and a TiCN layer may be placed anywhere other than the position directly on the TiN layer.

<Method for Manufacture>

The surface-coated cutting tool in the first aspect of the present invention can for example be manufactured in the following way.

First, the base material is prepared. In the case where the base material is a cemented carbide, it is preferable to perform once or more a composite step made up of a high-pressure temperature raise step and a low-pressure temperature raise step to thereby produce the base material.

Here, the high-pressure temperature raise step refers to the step of setting a base-material precursor (raw material powder molded into a desired shape) in a heating apparatus such as CVD furnace, and holding it in a high-pressure state where the pressure is 800 hPa to the atmospheric pressure (1013 hPa) and at a temperature of 900 to 1000° C. for 60 to 180 minutes while introducing an $H_2$ gas and an Ar gas at a low flow rate of total 0.5 to 5 L/min. This step increases the C concentration in the vicinity of the surface of the base material.

The low-pressure temperature raise step refers to the step of still setting the base-material precursor, which has undergone the high-pressure temperature raise step, in the same apparatus, and holding it in a low-pressure state where the pressure is 10 to 50 hPa and at a temperature of 900 to 1000° C. for 15 to 30 minutes while introducing an $H_2$ gas and an $N_2$ gas at a flow rate of total 10 to 50 L/min. This step further promotes the increase of the C concentration in the vicinity of the surface of the base material. Namely, these high-pressure temperature raise step and low-pressure temperature raise step are repeated once or more to thereby increase the C concentration in the surface of the base material. Accordingly, in the subsequent step of forming a coating (the step of forming a TiN layer), C in the base material is easily diffused into the TiN layer, and the TiN layer having the characteristics in the first aspect of the present invention is formed.

In the high-pressure temperature raise step, a higher pressure, a lower gas flow rate, or a higher temperature further promotes the increase of the C concentration in the vicinity of the surface of the base material. Likewise, in the low-pressure temperature raise step, a lower pressure, a lower gas flow rate, or a higher temperature further promotes the increase of the C concentration in the vicinity of the surface of the base material. Thus, the promotion of the increase of the C concentration in the vicinity of the surface of the base material accordingly increases the concentration of C diffused in the TiN layer.

In contrast, in the case where the base material is a ceramic material, a material having a composition containing C such as SiC for example can be selected and the base material can be produced by performing steps similar to the above-described steps for the cemented carbide, to thereby promote the increase of the C concentration in the vicinity of the surface of the base material.

In the case where the base material is cubic boron nitride, a binder having a composition containing C such as TiC or WC—Co can be selected and the base material can be produced by performing steps similar to the above-described steps for the cemented carbide, to thereby promote the increase of the C concentration in the vicinity of the surface of the base material.

Next, a TiN layer is formed on the surface of the base material prepared in the above-described manner. The TiN layer is preferably formed by means of CVD. For example, under a pressure of 40 to 100 hPa, reaction gases are applied into a CVD furnace, specifically an $H_2$ gas is applied at a flow rate of 15 to 40 L/min, an $N_2$ gas is applied at a flow rate of 10 to 30 L/min, and a $TiCl_4$ gas is applied at a flow rate of 1 to 5 L/min, and deposition is started at a temperature of 900 to 1000° C. After this, the deposition temperature is gradually lowered to a final temperature of 840 to 860° C. The time for this deposition is preferably 20 to 60 minutes. The temperature can thus be gradually lowered during formation (deposition) of the TiN layer to thereby generate a concentration distribution in the thickness direction of the TiN layer so that the concentration distribution includes a region where the concentration of C decreases in the direction from the base material toward the surface of the coating.

In this case, the lower the pressure, the lower the gas flow rate, or the greater the decrease of the temperature, the greater the difference between the maximum concentration and the minimum concentration that can be achieved in the concentration distribution.

In the case where the TiN layer is to be formed by means of PVD, the following conditions can be employed. Specifically, under an $N_2$ gas atmosphere, deposition is started with the conditions that the temperature is 700° C. or more, the pressure is 0.5 to 2 Pa, the arc current is 150 A, and the bias voltage is 30 V, the temperature is gradually lowered to a final temperature of 400 to 500° C., and the deposition is done for 20 to 30 minutes. In this way, the concentration distribution of C in the TiN layer similar to the above-described one can be generated.

In this case, the temperature can be made higher to thereby increase the difference between the maximum concentration and the minimum concentration in the concentration distribution.

In the case where a TiCN layer is subsequently formed on the TiN layer, the TiCN layer is preferably formed by means of CVD as well. Namely, for example, under a pressure of 40 to 100 hPa, reaction gases are applied into a CVD furnace, specifically an $H_2$ gas is applied at a flow rate of 50 to 100 L/min, an $N_2$ gas is applied at a flow rate of 10 to 40 L/min, a $TiCl_4$ gas is applied at a flow rate of 1 to 6 L/min, and a $CH_3CN$ gas is applied at a flow rate of 0.2 to 1.0 L/min, and deposition is done at a temperature of 800 to 870° C. The time for this deposition is preferably 100 to 200 minutes. Formation (deposition) of the TiCN layer can thus be done under a low-pressure condition of 100 hPa or less, more preferably 50 hPa or less, to thereby lower the deposition rate of the TiCN layer and promote diffusion of C in the TiCN layer into the already-formed TiN layer. Accordingly, a local minimum of C is generated in the concentration distribution of C in the TiN layer.

In this case, the lower the pressure, the lower the gas flow rate, or the higher the temperature, the farther the position of the local minimum away from the TiCN layer tends to be.

In the case where the TiCN layer is to be formed by means of PVD, the following conditions can be employed. Specifically, under a gas atmosphere made up of $CH_4$ and $N_2$, the conditions that the flow rate ratio $CH_4/N_2$ is 1/6 to 1/1, the arc current is 150 A, the bias voltage is 100 to 250 V, the temperature is 400 to 500° C., and the pressure is 0.5 to 3 Pa can be employed to generate a local minimum in the concentration distribution of C in the TiN layer as well.

In this case, the higher the temperature, the farther the position of the local minimum away from the TiCN layer tends to be.

In the case where another layer to serve as the coating is to be subsequently formed on the TiCN layer (the TiN layer in the case where the TiCN layer is not formed), this another layer may be formed by means of conventionally-known CVD or PVD. In this case, if the TiN layer and the TiCN layer are formed by means of CVD, preferably this another layer is also formed by means of CVD.

In this way, the surface-coated cutting tool having the characteristics in the first aspect of the present invention can be manufactured.

<Surface-Coated Cutting Tool in Second Aspect>
<Base Material>

The base material used for the surface-coated cutting tool in the second aspect of the present invention is made of a cemented carbide. It may for example be a WC-based cemented carbide, a cemented carbide containing WC and Co, or a cemented carbide containing WC and Co and additionally a carbonitride of Ti, Ta, Nb or the like. Any of cemented carbides of conventionally known compositions may be used as long as it contains C and Co, without being particularly limited.

In the case where the surface-coated cutting tool is an indexable insert or the like, the base material may or may not have a chip breaker, and the edge ridgeline may be shaped into a sharp edge (the ridge where the rake face and the flank face meet each other), shaped to have a honed edge (a sharp edge processed to be rounded (R)), shaped to have a negative land (beveled), or shaped to have a combination of the honed edge and the negative land.

<Coating>

The coating in the second aspect of the present invention is made up of one or two or more layers. Such a coating is generally formed for the purpose of improving various characteristics of the cutting tool such as wear resistance, fracture resistance, and the like, and/or making the used cutting edge identifiable.

The thickness of this coating is not particularly limited, and may for example be 3 to 20 µm, more preferably 4 to 15 µm. For this coating, any of conventionally known methods for forming (methods for depositing) such as physical vapor deposition (PVD) and chemical vapor deposition (CVD) may be used without being particularly limited. Above all, chemical vapor deposition may preferably be used for forming the coating, since use of chemical vapor deposition provides a relatively high deposition temperature of 800 to 1050° C. and superior adherence to the base material as compared with physical vapor deposition and the like.

<TiN Layer>

The coating in the second aspect of the present invention is made up of one or two or more layers as described above. Among the layers, it is a TiN layer that abuts on the base material. The TiN layer has an excellent function of having excellent adherence to a cemented carbide.

In the second aspect of the present invention, the TiN layer is characterized in that the TiN layer contains C (carbon) and Co (cobalt) together with TiN, the C and the Co each have a concentration distribution in the thickness direction of the TiN layer, the concentration distribution of C includes a region where the concentration of C decreases in the direction from the base material toward the surface of the coating, and the concentration distribution of Co includes a region where the concentration of Co decreases in the direction from the base material toward the surface of the coating. The TiN layer has these characteristics to thereby significantly improve the adherence between the base material and the coating.

The reason for the above appears to be the fact that C and Co in the base material diffuse into the TiN layer through the interface between the base material and the TiN layer to thereby improve the adherence between the base material and the TiN layer (coating). While C thus diffused in the TiN layer is a factor which is important from the standpoint of improving the adherence, C also has a contrary function of embrittling the coating. Due to this, the presence of C is not preferable from the standpoint of the strength of the coating. While Co is also an important factor from the standpoint of improving the adherence like C as described above, Co has a contrary function of reducing the hardness of the coating. Due to this, the presence of Co is not preferable from the standpoint of the hardness of the coating.

Thus, according to the second aspect of the present invention, a trade-off is made between these functions contrary to each other by providing C and Co so that C and Co are each present with its concentration distribution in the thickness direction of the TiN layer in which the concentration of C and that of Co are each higher as the distance from the base material is smaller and decrease toward the surface of the coating.

Namely, the TiN layer in the second aspect of the present invention is characterized in that the TiN layer contains C and Co together with TiN, these C and Co each have a concentration distribution in the thickness direction of the TiN layer, the concentration distribution of C includes a region where the concentration of C decreases in the direction from the base material toward the surface of the coating, and the concentration distribution of Co includes a region where the concentration of Co decreases in the direction from the base material toward the surface of the coating.

Here, in what form C (carbon) and Co (cobalt) are each present in the TiN layer is not particularly limited. C and Co are each assumed to be present in the atomic form or in the form of a solid solution of C or Co in TiN. "Includes a region where the concentration of C decreases in the direction from the base material toward the surface of the coating" means that the concentration distribution of C in the thickness direction of the TiN layer may include a portion where the concentration of C decreases in the direction from the base material toward the surface of the coating and, as long as the distribution includes this portion, it may also include a portion where the concentration of C is constant in the thickness direction, a portion where the concentration thereof increases toward the surface of the coating, or a portion without containing C, for example. Likewise, "includes a region where the concentration of Co decreases in the direction from the base material toward the surface of the coating" means that the concentration distribution of Co in the thickness direction of the TiN layer may include a portion where the concentration of Co decreases in the direction from the base material toward the surface of the coating and, as long as the distribution includes this portion, it may also include a portion where the concentration of Co is constant in the thickness direction, a portion where the concentration thereof increases toward the surface of the coating, or a portion without containing Co, for example.

It should be noted that "a region where the concentration of C decreases in the direction from the base material toward the surface of the coating" and "a region where the concentration of Co decreases in the direction from the base material toward the surface of the coating" may be identical to or overlap each other, or may be different from each other.

Moreover, C and Co in the TiN layer preferably have an atomic ratio that C is twice or more as high as Co, for the following reason. Namely, while C and Co are diffused into the TiN layer to thereby improve the adherence between the base material and the TiN layer as described above, an excessive amount of Co diffused in the TiN layer will considerably reduce the hardness of the TiN layer. More preferably, C and Co have an atomic ratio that C is three times or more as high as Co. Since both C and Co have respective concentration distributions in the thickness direction of the TiN layer, respective concentrations of C and Co have to be measured at the same position in the TiN layer.

Further, the concentration distribution has a difference between a maximum concentration and a minimum concentration of C of preferably 10 atomic % or more. C has a maximum concentration of preferably 30 atomic % or less. This is for the reason that if the maximum concentration of C is higher than 30 atomic %, the function of embrittling the coating is stronger than the function of improving the adherence, resulting in lower strength of the coating. If the difference between the maximum concentration and the minimum concentration of C is less than 10 atomic %, the function of improving the adherence may not sufficiently be performed. While the lower limit of the maximum concentration of C is not particularly limited, the lower limit is preferably 5 atomic % or more from the standpoint of sufficiently performing the function of improving the adherence. Since the maximum concentration of C is preferably 30 atomic % or less as described above, the difference between the maximum concentration and the minimum concentration of C is preferably 15 atomic % or less.

Moreover, in the concentration distribution, Co preferably has a maximum concentration of 5 atomic % or less. This is for the reason that if the maximum concentration of Co is higher than 5 atomic %, the function of reducing the hardness of the coating is stronger than the function of improving the adherence. While the lower limit of the maximum concentration of Co is not particularly limited, the lower limit thereof is preferably 1 atomic % or more from the standpoint of sufficiently performing the function of improving the adherence.

The concentration (atomic %) of C and Co herein refers to the percentage relative to all atoms constituting the TiN layer.

Further, the concentration distribution of C preferably has a distribution where the concentration of C decreases in the direction from the base material, then reaches a local minimum, and thereafter increases in the direction toward the surface of the coating. This is for the following reason. The presence of the local minimum of the concentration ensures a region where the concentration of C is lower, to thereby suppress embrittlement of the coating due to C. Accordingly the coating is prevented from having decreased strength. In addition, the increase of the concentration of C toward the surface of the coating enables the hardness of the coating to be increased.

The concentration of C may be increased toward the surface of the coating by means of a variety of methods. It appears to be easiest and preferable to diffuse C from a layer formed directly on the TiN layer.

In contrast, the concentration distribution of Co preferably has a distribution where the concentration of Co decreases in the direction from the base material toward the surface of the coating. This is for the following reason. In the vicinity of the base material, the concentration of Co is made higher to thereby improve the adherence to the base material. Meanwhile, the concentration of Co is made gradually lower as the distance from the base material increases to thereby prevent reduction of the hardness.

In this way, respective concentration distributions of C and Co are defined to thereby enable both the high strength and the high hardness of the coating to be achieved.

The TiN layer in the second aspect of the present invention preferably has a thickness of 0.1 to 0.5 μm (0.1 μm or more and 0.5 μm or less). If the thickness of the TiN layer is less than 0.1 μm, the function of improving the adherence may not sufficiently be exhibited. If the thickness of the TiN layer is more than 0.5 μm, the wear resistance of the coating as a whole may be deteriorated. The TiN layer has a thickness of more preferably 0.2 to 0.4 μm.

In the second aspect of the present invention, the composition of the coating and respective concentrations of C and Co in the coating can be identified through an EDS (energy dispersive X-ray analyzer) analysis of a cross section of the coating with a transmission electron microscope. The thickness of the coating can be measured through observation of a cross section of the coating with a scanning electron microscope.

<TiCN Layer>

The coating in the second aspect of the present invention preferably includes a TiCN layer located directly on the TiN layer. This TiCN layer contains TiCN. C (carbon) in the TiCN layer preferably has a maximum concentration of 20 atomic % or more. The TiCN layer thus placed directly on the TiN layer allows C to be diffused from the TiCN layer into the TiN layer and thereby improves the adherence between these layers.

C in the TiCN layer has a maximum concentration of preferably 20 atomic % or more, since this is necessary for improving the wear resistance of the TiCN layer. C has a maximum concentration of more preferably 30 atomic % or more, and its upper limit is preferably 60 atomic % or less, because the upper limit higher than 60 atomic % causes embrittlement and reduction of the strength.

Regarding the second aspect of the present invention, chemical formulas such as "TiN" and "TiCN" for which the atomic ratio is not particularly specified do not mean that the atomic ratio of each element is only "1". Rather, the atomic ratio may be any of all conventionally known atomic ratios. In particular, regarding TiCN in the TiCN layer, the ratio of C may be more than the stoichiometric ratio.

<Another Layer>

The coating in the second aspect of the present invention can further include another layer besides the TiN layer and the TiCN layer as described above. This another layer is formed on the TiCN layer (the TiN layer in the case where the TiCN layer is not formed).

This another layer is preferably one or more layers made of a compound of at least one element selected from the group consisting of group 4 elements, group 5 elements, and group 6 elements in the periodic table, Al, and Si and at least one element selected from the group consisting of boron, carbon, nitrogen, and oxygen. Another layer as described above can be formed to thereby improve various characteristics of the cutting tool such as wear resistance, fracture resistance, and the like, and/or make the used cutting edge identifiable.

Specific examples of the compound of which another layer as described above is made may for example be TiC, $Al_2O_3$, ZrN, TiAlN, TiBN, TiCN, TiN, CrN, ZrCN, $ZrO_2$, AlZrO, HfN, TiSiCN, $TiB_2$, TiAlCN, TiCNO, and $Ti_2O_3$.

The above-listed specific examples of the compound include TiN and TiCN, which means that a TiN layer may also be placed anywhere other than the position directly on the base material and a TiCN layer may be placed anywhere other than the position directly on the TiN layer.

<Method for Manufacture>

The surface-coated cutting tool in the second aspect of the present invention can for example be manufactured in the following way.

First, the base material is prepared. When the base material is to be produced, it is preferable to perform once or more a composite step made up of a high-pressure temperature raise step and a low-pressure temperature raise step to thereby produce the base material.

Here, the high-pressure temperature raise step refers to the step of setting a base-material precursor (raw material powder molded into a desired shape) in a heating apparatus such as CVD furnace, and holding it in a high-pressure state where the pressure is 800 hPa to the atmospheric pressure (1013 hPa) and at a temperature of 900 to 1000° C. for 60 to 180 minutes while introducing an $H_2$ gas and an Ar gas at a low flow rate of total 0.5 to 5 L/min. This step increases the C concentration and the Co concentration in the vicinity of the surface of the base material.

The low-pressure temperature raise step refers to the step of still setting the base-material precursor, which has undergone the high-pressure temperature raise step, in the same apparatus, and holding it in a low-pressure state where the pressure is 10 to 50 hPa and at a temperature of 900 to 1000° C. for 15 to 30 minutes while introducing an $H_2$ gas and an $N_2$ gas at a flow rate of total 10 to 50 L/min. This step further promotes the increase of the C concentration and the Co concentration in the vicinity of the surface of the base material. Namely, these high-pressure temperature raise step and low-pressure temperature raise step are repeated once or more to thereby increase the C concentration and the Co concentration in the surface of the base material. Accordingly, in the subsequent step of forming a coating (the step of forming a TiN layer), C and Co in the base material are easily diffused into the TiN layer, and the TiN layer having the characteristics in the second aspect of the present invention is formed.

In the high-pressure temperature raise step, a higher pressure, a lower gas flow rate, or a higher temperature further promotes the increase of the C concentration and the Co concentration in the vicinity of the surface of the base material. Likewise, in the low-pressure temperature raise step, a lower pressure, a lower gas flow rate, or a higher temperature further promotes the increase of the C concentration and the Co concentration in the vicinity of the surface of the base material. Thus, the promotion of the increase of the C concentration and the Co concentration in the vicinity of the surface of the base material accordingly increases respective concentrations of C and Co diffused in the TiN layer.

Next, a TiN layer is formed on the surface of the base material prepared in the above-described manner. The TiN layer is preferably formed by means of CVD. For example, under a pressure of 40 to 100 hPa, reaction gases are applied into a CVD furnace, specifically an $H_2$ gas is applied at a flow rate of 15 to 40 L/min, an $N_2$ gas is applied at a flow rate of 10 to 30 L/min, and a $TiCl_4$ gas is applied at a flow rate of 1 to 5 L/min, and deposition is started at a temperature of 900 to 1000° C. After this, the deposition temperature is gradually lowered to a final temperature of 840 to 860° C. The time for this deposition is preferably 20 to 60 minutes. The temperature can thus be gradually lowered during formation (deposition) of the TiN layer to thereby generate respective concentration distributions of C and Co in the thickness direction of the TiN layer so that the each concentration distribution includes a region where the concentration of C or Co decreases in the direction from the base material toward the surface of the coating.

In this case, the lower the pressure, the lower the flow rate, or the greater the decrease of the temperature, the greater the difference between the maximum concentration and the minimum concentration that can be achieved in each of the concentration distribution of C and the concentration distribution of Co.

In the case where the TiN layer is to be formed by means of PVD, the following conditions can be employed. Specifically, under an $N_2$ gas atmosphere, deposition is started with the conditions that the temperature is 700° C. or more, the pressure is 0.2 to 2 Pa, the arc current is 150 A, and the bias voltage is 30 V, the temperature is gradually lowered to a final temperature of 400 to 500° C., and the deposition is done for 20 to 30 minutes. In this way, the concentration distribution of C and that of Co similar to the above-described one can be generated in the TiN layer.

In this case, the temperature can be made higher to thereby increase the difference between the maximum concentration and the minimum concentration in each of respective concentration distributions of C and Co.

In the case where a TiCN layer is subsequently formed on the TiN layer, the TiCN layer is preferably formed by means of CVD as well. Namely, for example, under a pressure of 40 to 100 hPa, reaction gases are applied into a CVD furnace, specifically an $H_2$ gas is applied at a flow rate of 50 to 100 L/min, an $N_2$ gas is applied at a flow rate of 10 to 40 L/min, a $TiCl_4$ gas is applied at a flow rate of 1 to 6 L/min, and a $CH_3CN$ gas is applied at a flow rate of 0.2 to 1.0 L/min, and deposition is done at a temperature of 800 to 870° C. The time for this deposition is preferably 100 to 200 minutes. Formation (deposition) of the TiCN layer can thus be done under a low-pressure condition of 100 hPa or less, more preferably 50 hPa or less, to thereby lower the deposition rate of the TiCN layer and promote diffusion of C in the TiCN layer into the already-formed TiN layer. Accordingly, a local minimum of C is generated in the concentration distribution of C in the TiN layer.

In this case, the lower the pressure, the lower the gas flow rate, or the higher the temperature, the farther the position of the local minimum away from the TiCN layer tends to be.

In the case where the TiCN layer is to be formed by means of PVD, the following conditions can be employed. Specifically, under a gas atmosphere made up of $CH_4$ and $N_2$, the conditions that the flow rate ratio $CH_4/N_2$ is 1/6 to 1/1, the arc current is 150 A, the bias voltage is 100 to 250 V, the temperature is 400 to 500° C., and the pressure is 0.5 to 3 Pa can be employed to generate a local minimum in the concentration distribution of C in the TiN layer as well.

In this case, the higher the temperature, the farther the position of the local minimum away from the TiCN layer tends to be.

In the case where another layer to serve as the coating is to be subsequently formed on the TiCN layer (the TiN layer in the case where the TiCN layer is not formed), this another layer may be formed by means of conventionally-known CVD or PVD. In this case, if the TiN layer and the TiCN layer are formed by means of CVD, preferably this another layer is also formed by means of CVD.

In this way, the surface-coated cutting tool having the characteristics in the second aspect of the present invention can be manufactured.

EXAMPLES

In the following, the present invention will be described in more detail in connection with Examples. The present invention, however, is not limited to them.

Example 1

A raw material powder having a composition: 2.0 mass % of TaC, 10.0 mass % of Co, and the remaining percentage of WC (it should be noted that the composition contains inevitable impurities) was sufficiently mixed and thereafter press-formed into a desired shape and sintered. Regarding the shape, two different types, namely an indexable insert for milling having the shape of "SDKN42MT" (manufactured by Sumitomo Electric Hardmetal Corporation), and an indexable insert for turning having the shape of "CNMG120408N-GU" (manufactured by Sumitomo Electric Hardmetal Corporation) were produced.

Then, the base-material precursor having been press-formed as described above was set in a CVD furnace and held for 100 minutes under the conditions: the atmospheric pressure (1013 hPa), an $H_2$ gas flow rate of 2 L/min, an Ar gas flow rate of 2 L/min, and 910° C. (high-pressure temperature raise step).

Subsequently, the base-material precursor which had undergone the high-pressure temperature raise step and was still set in the CVD furnace was held for 20 minutes under the conditions: a pressure of 48 hPa, an $H_2$ gas flow rate of 18 L/min, an $N_2$ gas flow rate of 9 L/min, and a temperature of 910° C. (low-pressure temperature raise step).

In this way, base materials (of two different types of the shape) made of a cemented carbide to be used for cutting tools were produced. Subsequently, with each base material still set in the CVD furnace, a TiN layer was formed on each base material by means of CVD. Specifically, deposition was started under the conditions: a pressure of 48 hPa, an $H_2$ gas flow rate of 35 L/min, an $N_2$ gas flow rate of 18 L/min, a $TiCl_4$ gas flow rate of 2 L/min, and a temperature of 900° C. After this, the temperature was gradually lowered to a final temperature of 860° C. The time for deposition was 30 minutes. Accordingly, a TiN layer of 0.3 μm was formed on each base material.

Subsequently, on the TiN layer thus formed, a TiCN layer was formed by means of CVD. Specifically, under the conditions: a pressure of 48 hPa, an $H_2$ gas flow rate of 90 L/min, an $N_2$ gas flow rate of 30 L/min, a $TiCl_4$ gas flow rate of 5 L/min, a $CH_3CN$ gas flow rate of 0.8 L/min, and a temperature of 860° C., deposition was done for 200 minutes to thereby form a TiCN layer of 5.2 μm on the TiN layer.

After this, on the TiCN layer, other layers, namely an $Al_2O_3$ layer of 3.5 μm and a TiN layer of 0.5 μm were formed in this order by means of CVD. The $Al_2O_3$ layer was formed by vaporizing Al under the conditions: a pressure of 67 hPa, a temperature of 980° C., an $H_2$ gas flow rate of 40 L/min, a $CO_2$ gas flow rate of 2 L/min, and an HCl gas flow rate of 2 L/min (the time for deposition: 260 minutes). The TiN layer was formed under the conditions: a pressure of 67 hPa, a temperature of 980° C., an $H_2$ gas flow rate of 50 L/min, an $N_2$ gas flow rate of 35 L/min, a $TiCl_4$ gas flow rate of 4 L/min, and a deposition time of 30 minutes.

In this way, the surface-coated cutting tool in the first aspect of the present invention was produced. Each surface-coated cutting tool was cut along an arbitrary plane including a normal to a coating surface of the rake face and a normal to a coating surface of the flank face, and the resultant cross section was measured through an EDS analysis with a transmission electron microscope (the device name: "JEM-2100F" manufactured by JEOL Ltd.) under the condition that the acceleration voltage was 200 kV. It was accordingly confirmed that the TiN layer of 0.3 μm, the TiCN layer of 5.2 μm, the $Al_2O_3$ layer of 3.5 μm, and the TiN layer of 0.5 μm were formed in this order on the base material, the TiN layer located directly on the base material had the concentration distribution of C indicated in Table 1, and the maximum concentration of C in the TiCN layer was confirmed. The thickness of each layer was confirmed through observation of the aforementioned cross section with a scanning electron microscope (the device name: "S-3400" manufactured by Hitachi High-Technologies Corporation).

Examples 2 to 16

Surface-coated cutting tools of Examples 2 to 16 were produced in a similar manner to the surface-coated cutting tool of Example 1.

In contrast to Example 1, the conditions for the high-pressure temperature raise step and the conditions for the low-pressure temperature raise step for producing the base material, the conditions for forming the TiN layer, and the conditions for forming the TiCN layer were adjusted within respective ranges indicated below.

Specifically, the conditions for the high-pressure temperature raise step were adjusted within the ranges: the pressure from 800 hPa to the atmospheric pressure (1013 hPa), the $H_2$ gas flow rate from 0.5 to 5 L/min, the Ar gas flow rate from 0.5 to 5 L/min (the total flow rate of the $H_2$ gas and the Ar gas from 0.5 to 5 L/min), the temperature from 900 to 1000° C., and the holding time from 60 to 180 minutes. The conditions for the low-pressure temperature raise step were adjusted within the ranges: the pressure from 10 to 50 hPa, the $H_2$ gas flow rate from 10 to 50 L/min, the $N_2$ gas flow rate from 10 to 50 L/min (the total flow rate of the $H_2$ gas and the $N_2$ gas from 10 to 50 L/min), the temperature from 900 to 1000° C., and the holding time from 15 to 30 minutes.

The conditions for forming the TiN layer were adjusted within the following ranges. Deposition was started under the conditions: the pressure from 40 to 100 hPa, the $H_2$ gas flow rate from 15 to 40 L/min, the $N_2$ gas flow rate from 10 to 30 L/min, the $TiCl_4$ gas flow rate from 1 to 5 L/min, and the temperature from 900 to 1000° C., the temperature was thereafter gradually lowered to a final temperature of 840 to 860° C., and deposition was done for 20 to 60 minutes.

The conditions for forming the TiCN layer were adjusted within the ranges: the pressure from 40 to 100 hPa, the $H_2$ gas flow rate from 50 to 100 L/min, the $N_2$ gas flow rate from 10 to 40 L/min, the $TiCl_4$ gas flow rate from 1 to 6 L/min, the $CH_3CN$ gas flow rate from 0.2 to 1.0 L/min, the temperature from 800 to 870° C., and the deposition time from 100 to 200 minutes.

As to Example 11, the above conditions were as follows: a pressure of 110 hPa, an $H_2$ gas flow rate of 70 L/min, an $N_2$ gas flow rate of 50 L/min, a $TiCl_4$ gas flow rate of 6 L/min, a $CH_3CN$ gas flow rate of 1.5 L/min, a temperature of 880° C., and a deposition time of 80 minutes. Accordingly, no local minimum was generated.

As to Example 12, the above conditions were as follows: a pressure of 100 hPa, an $H_2$ gas flow rate of 60 L/min, an $N_2$ gas flow rate of 60 L/min, a $TiCl_4$ gas flow rate of 6 L/min, a $CH_3CN$ gas flow rate of 2.0 L/min, a temperature of 880° C., and a deposition time of 60 minutes. Accordingly, no local minimum was generated.

Other layers were produced under the same conditions as Example 1. For the surface-coated cutting tools thus produced, it was confirmed in a similar manner to Example 1 that the TiN layer located directly on the base material had the concentration distribution of C indicated in Table 1, and the maximum concentration of C in the TiCN layer was confirmed.

Examples 17 to 18

The base material and the TiN layer were produced under similar conditions to Example 1. After this, other layers were formed without forming the TiCN layer.

The other layers of Example 17 were a ZrN layer of 3.5 μm and a TiN layer of 2.5 μm formed in this order by means of CVD, and the other layers of Example 18 were a TiAlN layer of 3.5 μm and a TiSiCN layer of 2.5 μm formed in this order by means of CVD.

Regarding the other layers specified above, the ZrN layer was formed under the conditions: a pressure of 160 hPa, a temperature of 1000° C., a ZrCl$_4$ gas flow rate of 5 L/min, an N$_2$ gas flow rate of 20 L/min, an H$_2$ gas flow rate of 55 L/min, and a deposition time of 300 minutes, the TiN layer was formed under the conditions: a pressure of 133 hPa, a temperature of 900° C., a TiCl$_4$ gas flow rate of 5 L/min, an N$_2$ gas flow rate of 18 L/min, an H$_2$ gas flow rate of 30 L/min, and a deposition time of 210 minutes, the TiAlN layer was formed under the conditions: a pressure of 13 hPa, a temperature of 800° C., a TiCl$_4$ gas flow rate of 1 L/min, an AlCl$_3$ gas flow rate of 1.5 L/min, an NH$_3$ gas flow rate of 4 L/min, an N$_2$ gas flow rate of 12 L/min, an H$_2$ gas flow rate of 12 L/min, and a deposition time of 120 minutes, and the TiSiCN layer was formed under the conditions: a pressure of 40 hPa, a temperature of 830° C., a TiCl$_4$ gas flow rate of 2.5 L/min, an SiCl$_4$ gas flow rate of 0.5 L/min, an NH$_3$ gas flow rate of 5 L/min, a C$_2$H$_2$ gas flow rate of 5.5 L/min, an N$_2$ gas flow rate of 2 L/min, an H$_2$ gas flow rate of 50 L/min, and a deposition time of 60 minutes.

For the surface-coated cutting tools thus produced, it was confirmed in a similar manner to Example 1 that the TiN layer located directly on the base material had the concentration distribution of C indicated in Table 1. Regarding Examples 17 and 18, the TiCN layer was not formed on the TiN layer. Therefore, the relevant cells in Table 1 are left blank.

Examples 19 to 20

The base material was prepared in a similar manner to Example 1, and a coating was formed on the base material by means of PVD.

Regarding Example 19, a TiN layer of 0.3 μm was formed on the base material, and a TiCN layer of 3.5 μm was formed on the TiN layer. The TiN layer was formed under an N$_2$ gas atmosphere in which deposition was started with a temperature of 700° C., a pressure of 1 Pa, an arc current of 150 A, and a bias voltage of 30 V, and the temperature was thereafter gradually lowered to a final temperature of 450° C. (deposition time: 25 minutes). The TiCN layer was deposited under a gas atmosphere made up of CH$_4$ and N$_2$ with a gas flow rate ratio CH$_4$/N$_2$ of ¼, a temperature of 450° C., a pressure of 2 Pa, an arc current of 150 A, and a bias voltage of 150 V (deposition time: 180 minutes).

Regarding Example 20, a TiN layer of 0.3 μm was formed on the base material, a TiCN layer of 2.5 μm was formed on the TiN layer, and another layer, namely a TiN layer of 2.5 μm was formed on the TiCN layer. The TiN layer located directly on the base material was formed under an N$_2$ gas atmosphere in which deposition was started with a temperature of 700° C., a pressure of 1 Pa, an arc current of 150 A, and a bias voltage of 30 V, and the temperature was thereafter gradually lowered to a final temperature of 450° C. (deposition time: 25 minutes). The TiCN layer was deposited under a gas atmosphere made up of CH$_4$ and N$_2$ with a gas flow rate ratio CH$_4$/N$_2$ of ¼, a temperature of 450° C., a pressure of 2 Pa, an arc current of 150 A, and a bias voltage of 150 V (deposition time: 120 minutes). Another layer, namely the TiN layer was deposited under an N$_2$ gas atmosphere with a temperature of 450° C., a pressure of 2 Pa, an arc current of 150 A and a bias voltage of 50 V (deposition time: 40 minutes).

For the surface-coated cutting tools thus produced, it was confirmed in a similar manner to Example 1 that the TiN layer located directly on the base material had the concentration distribution of C indicated in Table 1, and the maximum concentration of C in the TiCN layer was confirmed.

Examples 21 to 22

As to Example 21, a ceramic material was employed as the base material composition, and the shape similar to Example 1 was used. For the base material, SiC was used and the base material was produced under the same conditions as the conditions for the cemented carbide of Example 1.

As to Example 22, cubic boron nitride was employed as the base material composition, and the shape similar to Example 1 was used. The base material was the cubic boron nitride for which TiC was used as a binder, and produced under the same conditions as the conditions for the cemented carbide of Example 1.

Then, on each base material as described above, a coating was formed by means of physical vapor deposition, in a similar manner to Example 19.

For the surface-coated cutting tools thus produced, it was confirmed in a similar manner to Example 1 that the TiN layer located directly on the base material had the concentration distribution of C indicated in Table 1, and the maximum concentration of C in the TiCN layer was confirmed.

Comparative Examples 1 to 2

In a similar manner to Example 1, a base material was prepared. On the base material, a coating as described below was formed by means of CVD (it should be noted that the coating had a structure in which the TiN layer was not formed directly on the base material).

As to Comparative Example 1, a TiAlN layer of 3.5 μm was formed on the base material, and a TiCN layer of 2.5 μm was formed on the TiAlN layer. The TiAlN layer was formed under the conditions: a pressure of 13 hPa, a temperature of 800° C., a TiCl$_4$ gas flow rate of 1 L/min, an AlCl$_3$ gas flow rate of 1.5 L/min, an NH$_3$ gas flow rate of 4 L/min, an N$_2$ gas flow rate of 12 L/min, an H$_2$ gas flow rate of 12 L/min, and a deposition time of 120 minutes. The TiCN layer was formed through deposition for 180 minutes under the conditions: a pressure of 60 hPa, an H$_2$ gas flow rate of 70 L/min, an N$_2$ gas flow rate of 50 L/min, a TiCl$_4$ gas flow rate of 10 L/min, a CH$_3$CN gas flow rate of 1.5 L/min, and a temperature of 840° C.

As to Comparative Example 2, a TiBN layer of 3.5 μm was formed on the base material. The TiBN layer was formed under the conditions: a pressure of 67 hPa, a temperature of 980° C., a TiCl$_4$ gas flow rate of 1 L/min, a BCl$_3$ gas flow rate of 0.5 L/min, an N$_2$ gas flow rate of 1 L/min, an H$_2$ gas flow rate of 40 L/min, and a deposition time of 300 minutes.

For the surface-coated cutting tools thus produced, the structure of the coating was identified in a similar manner to Example 1. It was accordingly confirmed that no TiN layer was formed directly on the base material (see Table 2).

Comparative Examples 3 to 6

In a similar manner to that for the surface-coated cutting tool of Example 1, surface-coated cutting tools of Comparative Examples 3 to 6 were produced.

In contrast to Example 1, the conditions were changed as follows.

Specifically, as to Comparative Examples 3 and 4, the base material was produced without the high-pressure temperature raise step and the low-pressure temperature raise step. Rather, the base material was prepared through a temperature raise step similar to the conventional one (pressure: 800 hPa, $H_2$ gas flow rate: 10 L/min, Ar gas flow rate: 10 L/min, temperature: 850° C., temperature raise time: 60 minutes). The TiN layer was formed under similar conditions to Example 1 except that the temperature was a constant temperature of 850° C. The TiCN layer was formed in a similar manner to Example 1 (except that the deposition time of Comparative Example 3 was 150 minutes).

As to Comparative Example 5, the base material was prepared in a similar manner to Example 1. The TiN layer was formed through deposition for 30 minutes under the conditions: a pressure of 70 hPa, an $H_2$ gas flow rate of 60 L/min, an $N_2$ gas flow rate of 60 L/min, a $TiCl_4$ gas flow rate of 10 L/min, and a constant temperature of 860° C. The TiCN layer was formed through deposition for 120 minutes under the conditions: a pressure of 60 hPa, an $H_2$ gas flow rate of 60 L/min, an $N_2$ gas flow rate of 50 L/min, a $TiCl_4$ gas flow rate of 10 L/min, a $CH_3CN$ gas flow rate of 2 L/min, and a temperature of 860° C.

As to Comparative Example 6, the surface-coated cutting tool was produced in a similar manner to Example 1 except that the TiN layer was formed with a deposition start temperature of 900° C. and a deposition end temperature of 880° C.

TABLE 1

| | TiN layer (μm) | TiCN layer (μm) | concentration distribution of C in TiN layer | | | maximum concentration (at %) of C in TiCN layer |
|---|---|---|---|---|---|---|
| | | | difference (at %) | maximum concentration (at %) | local minimum | |
| Example 1 | 0.3 | 5.2 | 15 | 28 | present | 40 |
| Example 2 | 0.2 | 8.6 | 11 | 22 | present | 32 |
| Example 3 | 0.5 | 3.5 | 18 | 25 | present | 32 |
| Example 4 | 0.3 | 4.8 | 12 | 18 | present | 48 |
| Example 5 | 0.3 | 4.5 | 15 | 25 | present | 35 |
| Example 6 | 0.3 | 4.5 | 8 | 15 | present | 48 |
| Example 7 | 0.5 | 3.5 | 5 | 10 | present | 35 |
| Example 8 | 0.5 | 4.5 | 8 | 15 | present | 32 |
| Example 9 | 0.3 | 4.5 | 15 | 28 | present | 35 |
| Example 10 | 0.3 | 3.5 | 12 | 28 | present | 35 |
| Example 11 | 0.3 | 1.5 | 15 | 25 | absent | 45 |
| Example 12 | 0.3 | 1.0 | 12 | 28 | absent | 32 |
| Example 13 | 0.05 | 4.5 | 12 | 25 | present | 32 |
| Example 14 | 0.6 | 3.5 | 15 | 22 | present | 45 |
| Example 15 | 0.3 | 5.2 | 15 | 28 | present | 25 |
| Example 16 | 0.3 | 3.5 | 12 | 25 | present | 20 |
| Example 17 | 0.3 | — | 12 | 25 | present | — |
| Example 18 | 0.3 | — | 15 | 25 | present | — |
| Example 19 | 0.3 | 3.5 | 12 | 28 | present | 35 |
| Example 20 | 0.3 | 2.5 | 12 | 25 | present | 42 |
| Example 21 | 0.3 | 3.5 | 12 | 15 | present | 35 |
| Example 22 | 0.3 | 3.5 | 12 | 15 | present | 35 |

TABLE 2

| | TiN layer (μm) | TiCN layer (μm) | concentration distribution of C in TiN layer | | | maximum concentration (at %) of C in TiCN layer |
|---|---|---|---|---|---|---|
| | | | difference (at %) | maximum concentration (at %) | local minimum | |
| Comparative Example 1 | — | 2.5 | — | — | — | — |
| Comparative Example 2 | — | — | — | — | — | — |
| Comparative Example 3 | 0.3 | 3.5 | 0 | 0 | absent | 32 |
| Comparative Example 4 | 0.3 | 5.2 | 0 | 0 | absent | 32 |
| Comparative Example 5 | 0.3 | 3.5 | 0 | 15 | absent | 32 |
| Comparative Example 6 | 0.3 | 5.2 | 5 | 25 | absent | 32 |

In Table 1, "at %" represents atomic %, "difference" in the concentration distribution of C in the TiN layer refers to a difference between the maximum concentration and the minimum concentration of C in the concentration distribution, "maximum concentration" refers to the maximum concentration of C in the concentration distribution, "present" in the column "local minimum" means that a distribution is exhibited in which the concentration of C decreases in the direction from the base material, then reaches the local minimum, and thereafter increases toward the surface of the coating (namely such a local minimum is present), and "absent" in this column means that such a local minimum is absent and the concentration of C continuously decreases in the direction from the base material toward the surface of the coating. Regardless of whether a cell in the column "local minimum" indicates "present" or "absent", the TiN layer still has a concentration distribution of C in the thickness direction and the distribution still includes a region where the concentration of C decreases in the direction from the base material toward the surface of the coating.

The expressions in Table 2 are basically similar in meaning to those in Table 1. Regarding Comparative Examples 3 and 4, however, although the TiN layer is formed directly on the base material, the TiN layer does not contain C. Regarding Comparative Example 5, although the TiN layer is formed directly on the base material and the TiN layer contains C, this C does not have its concentration distribution (namely the concentration of C is constant in the thickness direction). Regarding Comparative Example 6, although the TiN layer is formed directly on the base material and the TiN layer has a concentration distribution of C, the concentration of C in the concentration distribution continuously increases in the direction from the base material toward the surface of the coating.

<Evaluation>

For the surface-coated cutting tools (indexable inserts for milling and indexable inserts for turning) of the Examples and the Comparative Examples each that were produced as described above, cutting tests of two different types as described below were conducted to thereby made evaluations. The results are shown in Table 3 below.

<Cutting Test 1: Evaluation of Wear Resistance in Milling>

An indexable insert for milling was used as the surface-coated cutting tool, cutting was performed under the cutting conditions that the workpiece to be cut was SCM435 (a block of 300 mm in length×200 mm in width), the cutting speed was 300 m/min, the feed rate was 0.25 mm/t, and a cut of 1.5 mm was made without cutting oil, and the wear resistance in milling was evaluated. At the time when cutting had been performed for 15 minutes, the average wear width Vb (mm) of the flank face was measured. The insert having a smaller average wear width Vb has higher wear resistance.

<Cutting Test 2: Evaluation of Wear Resistance in Turning>

An indexable insert for turning was used as the surface-coated cutting tool, cutting was performed under the cutting conditions that the workpiece to be cut was SCM415 (350 mm in diameter×500 mm in length), the cutting speed was 200 m/min, the feed rate was 0.3 mm/t, and a cut of 1.5 mm was made with a water-soluble cutting fluid as the cutting oil, and the wear resistance in turning was evaluated. At the time when cutting had been performed for 30 minutes, the average wear width Vb (mm) of the flank face was measured. The insert having a smaller average wear width Vb has higher wear resistance.

TABLE 3

|  | cutting test 1 Vb (mm) | cutting test 2 Vb (mm) |
| --- | --- | --- |
| Example 1 | 0.085 | 0.104 |
| Example 2 | 0.087 | 0.115 |
| Example 3 | 0.075 | 0.109 |
| Example 4 | 0.088 | 0.112 |
| Example 5 | 0.085 | 0.115 |
| Example 6 | 0.092 | 0.117 |
| Example 7 | 0.095 | 0.119 |
| Example 8 | 0.095 | 0.117 |
| Example 9 | 0.102 | 0.121 |
| Example 10 | 0.103 | 0.121 |
| Example 11 | 0.121 | 0.125 |
| Example 12 | 0.108 | 0.126 |
| Example 13 | 0.135 | 0.127 |
| Example 14 | 0.132 | 0.129 |
| Example 15 | 0.138 | 0.131 |
| Example 16 | 0.136 | 0.135 |
| Example 17 | 0.139 | 0.135 |
| Example 18 | 0.142 | 0.138 |
| Example 19 | 0.157 | 0.142 |
| Example 20 | 0.152 | 0.146 |
| Example 21 | 0.175 | 0.155 |
| Example 22 | 0.192 | 0.162 |
| Comparative Example 1 | 0.325 | 0.278 |
| Comparative Example 2 | 0.278 | 0.299 |
| Comparative Example 3 | 0.285 | 0.315 |
| Comparative Example 4 | 0.262 | 0.324 |
| Comparative Example 5 | 0.314 | 0.335 |
| Comparative Example 6 | 0.281 | 0.295 |

As clearly seen from Table 3, it has been confirmed that the surface-coated cutting tools of the Examples have improved wear resistance relative to the surface-coated cutting tools of the Comparative Examples and have significantly improved tool life. It has accordingly been confirmed that the surface-coated cutting tool of the present invention is well adaptable to high-speed machining. This is apparently for the reason that the surface-coated cutting tool of the present invention has the characteristics of the present invention to thereby have improved adherence between the base material and the coating.

Example 101

A raw material powder having a composition: 2.0 mass % of TaC, 10.0 mass % of Co, and the remaining percentage of WC (it should be noted that the composition contains inevitable impurities) was sufficiently mixed and thereafter press-formed into a desired shape and sintered. Regarding the shape, two different types, namely an indexable insert for milling having the shape of "SDKN42MT" (manufactured by Sumitomo Electric Hardmetal Corporation), and an indexable insert for turning having the shape of "CNMG120408N-GU" (manufactured by Sumitomo Electric Hardmetal Corporation) were produced.

Then, the base-material precursor having been press-formed as described above was set in a CVD furnace and held for 100 minutes under the conditions: the atmospheric pressure (1013 hPa), an $H_2$ gas flow rate of 2 L/min, an Ar gas flow rate of 2 L/min, and 910° C. (high-pressure temperature raise step).

Subsequently, the base-material precursor which had undergone the high-pressure temperature raise step and was still set in the CVD furnace was held for 20 minutes under the conditions: a pressure of 48 hPa, an $H_2$ gas flow rate of 30 L/min, an $N_2$ gas flow rate of 25 L/min, and a temperature of 910° C. (low-pressure temperature raise step).

In this way, base materials (of two different types of the shape) made of a cemented carbide to be used for cutting tools were produced. Subsequently, with each base material still set in the CVD furnace, a TiN layer was formed on each base material by means of CVD. Specifically, deposition was started under the conditions: a pressure of 48 hPa, an $H_2$ gas flow rate of 35 L/min, an $N_2$ gas flow rate of 18 L/min, a $TiCl_4$ gas flow rate of 2 L/min, and a temperature of 900° C. After this, the temperature was gradually lowered to a final temperature of 860° C. The time for deposition was 30 minutes. Accordingly, a TiN layer of 0.3 μm was formed on each base material (see Table 4).

Subsequently, on the TiN layer thus formed, a TiCN layer was formed by means of CVD. Specifically, under the conditions: a pressure of 48 hPa, an $H_2$ gas flow rate of 90 L/min, an $N_2$ gas flow rate of 30 L/min, a $TiCl_4$ gas flow rate of 5 L/min, a $CH_3CN$ gas flow rate of 0.8 L/min, and a temperature of 860° C., deposition was done for 173 minutes to thereby form a TiCN layer of 4.5 μm on the TiN layer (see Table 4).

After this, on the TiCN layer, other layers, namely an $Al_2O_3$ layer of 3.0 μm and a TiN layer of 0.5 μm were formed in this order by means of CVD. The $Al_2O_3$ layer was formed by vaporizing Al under the conditions: a pressure of 67 hPa, a temperature of 980° C., an $H_2$ gas flow rate of 40 L/min, a $CO_2$ gas flow rate of 2 L/min, and an HCl gas flow rate of 2 L/min (the time for deposition: 220 minutes). The TiN layer was formed under the conditions: a pressure of 67 hPa, a temperature of 980° C., an $H_2$ gas flow rate of 50 L/min, an $N_2$ gas flow rate of 35 L/min, a $TiCl_4$ gas flow rate of 4 L/min, and a deposition time of 30 minutes.

In this way, the surface-coated cutting tool in the second aspect of the present invention was produced. Each surface-coated cutting tool was cut along an arbitrary plane including a normal to a coating surface of the rake face and a normal to a coating surface of the flank face, and the resultant cross section was measured through an EDS analysis with a transmission electron microscope (the device name: "JEM-2100F" manufactured by JEOL Ltd.) under the condition that the acceleration voltage was 200 kV. It was accordingly confirmed that the TiN layer of 0.3 μm, the TiCN layer of 4.5 μm, the $Al_2O_3$ layer of 3.0 μm, and the TiN layer of 0.5 μm were formed in this order on the base material, the TiN layer located directly on the base material had the concentration distribution of C and the concentration distribution of Co indicated in Table 4, and the maximum concentration of C in the TiCN layer was confirmed. The thickness of each layer was confirmed through observation of the aforementioned cross section with a scanning electron microscope (the device name: "S-3400" manufactured by Hitachi High-Technologies Corporation).

Examples 102 to 117

Surface-coated cutting tools of Examples 102 to 117 were produced in a similar manner to the surface-coated cutting tool of Example 101.

In contrast to Example 101, the conditions for the high-pressure temperature raise step and the conditions for the low-pressure temperature raise step for producing the base material, the conditions for forming the TiN layer, and the conditions for forming the TiCN layer were adjusted within respective ranges indicated below.

Specifically, the conditions for the high-pressure temperature raise step were adjusted within the ranges: the pressure from 800 hPa to the atmospheric pressure (1013 hPa), the $H_2$ gas flow rate from 0.5 to 5 L/min, the Ar gas flow rate from 0.5 to 5 L/min (the total flow rate of the $H_2$ gas and the Ar gas from 0.5 to 5 L/min), the temperature from 900 to 1000° C., and the holding time from 60 to 180 minutes.

The conditions for the low-pressure temperature raise step were adjusted within the ranges: the pressure from 10 to 50 hPa, the $H_2$ gas flow rate from 10 to 50 L/min, the $N_2$ gas flow rate from 10 to 50 L/min (the total flow rate of the $H_2$ gas and the $N_2$ gas from 10 to 50 L/min), the temperature from 900 to 1000° C., and the holding time from 15 to 30 minutes.

The conditions for forming the TiN layer were adjusted within the following ranges. Deposition was started under the conditions: the pressure from 40 to 100 hPa, the $H_2$ gas flow rate from 15 to 40 L/min, the $N_2$ gas flow rate from 10 to 30 L/min, the $TiCl_4$ gas flow rate from 1 to 5 L/min, and the temperature from 900 to 1000° C., the temperature was thereafter gradually lowered to a final temperature of 840 to 860° C., and the deposition was done for 20 to 60 minutes.

The conditions for forming the TiCN layer were adjusted within the ranges: the pressure from 40 to 100 hPa, the $H_2$ gas flow rate from 50 to 100 L/min, the $N_2$ gas flow rate from 10 to 40 L/min, the $TiCl_4$ gas flow rate from 1 to 6 L/min, the $CH_3CN$ gas flow rate from 0.2 to 1.0 L/min, the temperature from 800 to 870° C., and the deposition time from 100 to 200 minutes.

As to Example 113, the above conditions were as follows: a pressure of 50 hPa, an $H_2$ gas flow rate of 60 L/min, an $N_2$ gas flow rate of 60 L/min, a $TiCl_4$ gas flow rate of 8 L/min, a $CH_3CN$ gas flow rate of 1.2 L/min, a temperature of 870° C., and a deposition time of 180 minutes. Accordingly, no local minimum was generated.

Other layers were produced under the same conditions as Example 101. For the surface-coated cutting tools thus produced, it was confirmed in a similar manner to Example 101 that the TiN layer located directly on the base material had the concentration distribution of C and the concentration distribution of Co indicated in Table 4, and the maximum concentration of C in the TiCN layer was confirmed.

Examples 118 to 119

The base material and the TiN layer were produced under similar conditions to Example 101. After this, other layers were formed without forming the TiCN layer.

The other layers of Example 118 were a ZrN layer of 3.5 μm and a TiN layer of 2.5 μm formed in this order by means of CVD, and the other layers of Example 119 were a TiAlN layer of 3.5 μm and a TiSiCN layer of 2.5 μm formed in this order by means of CVD.

Regarding the other layers specified above, the ZrN layer was formed under the conditions: a pressure of 160 hPa, a temperature of 1000° C., a $ZrCl_4$ gas flow rate of 5 L/min, an $N_2$ gas flow rate of 20 L/min, an $H_2$ gas flow rate of 55 L/min, and a deposition time of 300 minutes, the TiN layer was formed under the conditions: a pressure of 133 hPa, a temperature of 900° C., a $TiCl_4$ gas flow rate of 5 L/min, an $N_2$ gas flow rate of 18 L/min, an $H_2$ gas flow rate of 30 L/min, and a deposition time of 210 minutes, the TiAlN layer was formed under the conditions: a pressure of 13 hPa, a temperature of 800° C., a $TiCl_4$ gas flow rate of 1 L/min, an $AlCl_3$ gas flow rate of 1.5 L/min, an $NH_3$ gas flow rate of 4 L/min, an $N_2$ gas flow rate of 12 L/min, an $H_2$ gas flow rate of 12 L/min, and a deposition time of 120 minutes, and the TiSiCN layer was formed under the conditions: a pressure of 40 hPa, a temperature of 830° C., a TiCl$_4$ gas flow rate of 2.5 L/min, an SiCl$_4$ gas flow rate of 0.5 L/min, an NH$_3$ gas flow rate of 5 L/min, a C$_2$H$_4$ gas flow rate of 5.5 L/min, an N$_2$ gas flow rate of 2 L/min, an H$_2$ gas flow rate of 50 L/min, and a deposition time of 60 minutes.

For the surface-coated cutting tools thus produced, it was confirmed in a similar manner to Example 101 that the TiN layer located directly on the base material had the concentration distribution of C and the concentration distribution of Co indicated in Table 4. Regarding Examples 118 and 119, the TiCN layer was not formed on the TiN layer. Therefore, the relevant cells in Table 4 are left blank.

Examples 120 to 121

The base material was prepared in a similar manner to Example 101, and a coating was formed on the base material by means of PVD.

Regarding Example 120, a TiN layer of 0.3 μm was formed on the base material, and a TiCN layer of 3.5 μm was formed on the TiN layer. The TiN layer was formed under an N$_2$ gas atmosphere in which deposition was started with a temperature of 700° C., a pressure of 1 Pa, an arc current of 150 A, and a bias voltage of 50 V, and the temperature was thereafter gradually lowered to a final temperature of 450° C. (deposition time: 25 minutes). The TiCN layer was deposited under a gas atmosphere made up of CH$_4$ and N$_2$ with a gas flow rate ratio CH$_4$/N$_2$ of ¼, a temperature of 450° C., a pressure of 2 Pa, an arc current of 150 A, and a bias voltage of 150 V (deposition time: 180 minutes).

Regarding Example 121, a TiN layer of 0.3 μm was formed on the base material, a TiCN layer of 2.5 μm was formed on the TiN layer, and another layer, namely a TiN layer of 2.5 μm was formed on the TiCN layer. The TiN layer located directly on the base material was formed under an N$_2$ gas atmosphere in which deposition was started with a temperature of 700° C., a pressure of 1 Pa, an arc current of 150 A, and a bias voltage of 30 V, and the temperature was thereafter gradually lowered to a final temperature of 450° C. (deposition time: 25 minutes). The TiCN layer was deposited under a gas atmosphere made up of CH$_4$ and N$_2$ with a gas flow rate ratio CH$_4$/N$_2$ of ¼, a temperature of 450° C., a pressure of 2 Pa, an arc current of 150 A, and a bias voltage of 150 V (deposition time: 120 minutes). Another layer, namely the TiN layer was deposited under an N$_2$ gas atmosphere with a temperature of 450° C., a pressure of 2 Pa, an arc current of 150 A and a bias voltage of 50 V (deposition time: 40 minutes).

For the surface-coated cutting tools thus produced, it was confirmed in a similar manner to Example 101 that the TiN layer located directly on the base material had the concentration distribution of C and the concentration distribution of Co indicated in Table 4, and the maximum concentration of C in the TiCN layer was confirmed.

Comparative Examples 101 to 102

In a similar manner to Example 101, a base material was prepared. On the base material, a coating as described below was formed by means of CVD (it should be noted that the coating had a structure in which the TiN layer was not formed directly on the base material).

As to Comparative Example 101, a TiAlN layer of 3.5 μm was formed on the base material, and a TiCNO layer of 2.5 μm and a TiN layer of 0.5 μm were formed in this order on the TiAlN layer. The TiAlN layer was formed under the conditions: a pressure of 13 hPa, a temperature of 800° C., a TiCl$_4$ gas flow rate of 1 L/min, an AlCl$_3$ gas flow rate of 1.5 L/min, an NH$_3$ gas flow rate of 4 L/min, an N$_2$ gas flow rate of 12 L/min, an H$_2$ gas flow rate of 12 L/min, and a deposition time of 120 minutes. The TiCNO layer was formed through deposition for 240 minutes under the conditions: a pressure of 90 hPa, a temperature of 900° C., a TiCl$_4$ gas flow rate of 0.5 L/min, an N$_2$ gas flow rate of 10 L/min, a CO gas flow rate of 0.5 L/min, and an H$_2$ gas flow rate of 20 L/min. The TiN layer was formed under the conditions: a pressure of 133 hPa, a temperature of 900° C., a TiCl$_4$ gas flow rate of 5 L/min, an N$_2$ gas flow rate of 18 L/min, an H$_2$ gas flow rate of 30 L/min, and a deposition time of 40 minutes.

As to Comparative Example 102, a TiBN layer of 3.5 μm was formed on the base material, and a TiB$_2$ layer of 1.5 μm and a TiN layer of 0.3 μm were formed in this order on the TiBN layer. The TiBN layer was formed under the conditions: a pressure of 67 hPa, a temperature of 980° C., a TiCl$_4$ gas flow rate of 1 L/min, a BCl$_3$ gas flow rate of 0.5 L/min, an N$_2$ gas flow rate of 1 L/min, an H$_2$ gas flow rate of 40 L/min, and a deposition time of 300 minutes. The TiB$_2$ layer was formed under the conditions: a pressure of 800 hPa, a temperature of 900° C., a TiCl$_4$ gas flow rate of 3 L/min, a BCl$_3$ gas flow rate of 8 L/min, an H$_2$ gas flow rate of 35 L/min, and a deposition time of 60 minutes. The TiN layer was formed under the conditions: a pressure of 133 hPa, a temperature of 900° C., a TiCl$_4$ gas flow rate of 5 L/min, an N$_2$ gas flow rate of 18 L/min, an H$_2$ gas flow rate of 30 L/min, and a deposition time of 25 minutes.

For the surface-coated cutting tools thus produced, the structure of the coating was identified in a similar manner to Example 101. It was accordingly confirmed that no TiN layer was formed directly on the base material (see Table 5).

Comparative Examples 103 to 107

In a similar manner to that for the surface-coated cutting tool of Example 101, surface-coated cutting tools of Comparative Examples 103 to 107 were produced (see Table 5).

In contrast to Example 101, the conditions were changed as follows.

Specifically, as to Comparative Examples 103 and 104, the base material was produced without the high-pressure temperature raise step and the low-pressure temperature raise step. Rather, the base material was prepared through a temperature raise step similar to the conventional one (pressure: 800 hPa, H$_2$ gas flow rate: 10 L/min, Ar gas flow rate: 10 L/min, temperature: 850° C., temperature raise time: 60 minutes). The TiN layer was formed under similar conditions to Example 101 except that the temperature was a constant temperature of 850° C. The TiCN layer was formed in a similar manner to Example 101 (except that the deposition time of Comparative Example 104 was 200 minutes).

As to Comparative Example 105, the base material was prepared in a similar manner to Example 101. The TiN layer was formed through deposition for 30 minutes under the conditions: a pressure of 70 hPa, an H$_2$ gas flow rate of 60 L/min, an N$_2$ gas flow rate of 60 L/min, a TiCl$_4$ gas flow rate of 10 L/min, and a constant temperature of 800° C. The TiCN layer was formed through deposition for 120 minutes under the conditions: a pressure of 60 hPa, an H$_2$ gas flow rate of 60 L/min, an N$_2$ gas flow rate of 50 L/min, a TiCl$_4$ gas flow rate of 10 L/min, a CH$_3$CN gas flow rate of 2 L/min, and a temperature of 860° C.

As to Comparative Example 106, the surface-coated cutting tool was produced in a similar manner to Example 101 except that the TiN layer was formed with a deposition start temperature of 900° C. and a deposition end temperature of 880° C.

As to Comparative Example 107, the surface-coated cutting tool was produced in a similar manner to Example 101 except that the deposition temperature for forming the TiN layer was a constant temperature of 950° C.

Other layers were produced under the same conditions as Example 101. For the surface-coated cutting tools thus produced, it was confirmed in a similar manner to Example 101 that the TiN layer located directly on the base material had the concentration distribution of C and the concentration distribution of Co, and the maximum concentration of C in the TiCN layer was confirmed.

minimum concentration of C in the concentration distribution, "maximum concentration" refers to the maximum concentration of C in the concentration distribution, "present" in the column "local minimum" means that a distribution is exhibited in which the concentration of C decreases in the direction from the base material, then reaches the local minimum, and thereafter increases toward the surface of the coating (namely such a local minimum is present), and "absent" in this column means that such a local minimum is absent and the concentration of C continuously decreases in the direction from the base material toward the surface of the coating. Regardless of whether a cell in the column "local minimum" indicates "present" or "absent", the TiN layer still has a concentration distribution of C in the thickness

TABLE 4

| | TiN layer (μm) | TiCN layer (μm) | concentration distribution of C in TiN layer | | | concentration distribution of Co in TiN layer | | | maximum concentration (at %) of C in TiCN layer |
|---|---|---|---|---|---|---|---|---|---|
| | | | difference (at %) | maximum concentration (at %) | local minimum | maximum concentration (at %) | distribution | C/Co | |
| Example 101 | 0.3 | 4.5 | 11 | 25 | present | 4.5 | decrease | 5.5 | 40 |
| Example 102 | 0.2 | 5.0 | 15 | 28 | present | 3.5 | decrease | 3.5 | 32 |
| Example 103 | 0.5 | 3.5 | 18 | 18 | present | 4.5 | decrease | 2.1 | 35 |
| Example 104 | 0.3 | 7.5 | 15 | 25 | present | 4.8 | decrease | 4.5 | 35 |
| Example 105 | 0.3 | 4.5 | 12 | 25 | present | 3.2 | decrease | 3.5 | 48 |
| Example 106 | 0.3 | 5.0 | 15 | 28 | present | 4.5 | decrease | 1.8 | 35 |
| Example 107 | 0.5 | 3.5 | 12 | 20 | present | 2.8 | decrease | 1.5 | 32 |
| Example 108 | 0.3 | 4.5 | 5 | 15 | present | 4.8 | decrease | 3.5 | 45 |
| Example 109 | 0.5 | 3.5 | 8 | 10 | present | 4.2 | decrease | 4.5 | 35 |
| Example 110 | 0.5 | 4.5 | 8 | 15 | present | 3.5 | decrease | 2.5 | 32 |
| Example 111 | 0.3 | 4.5 | 12 | 32 | present | 4.8 | decrease | 3 | 32 |
| Example 112 | 0.3 | 3.5 | 15 | 28 | present | 5.8 | decrease | 3.5 | 45 |
| Example 113 | 0.3 | 1.5 | 12 | 28 | absent | 2.5 | decrease | 2.5 | 35 |
| Example 114 | 0.08 | 4.5 | 12 | 25 | present | 3.5 | decrease | 2.5 | 35 |
| Example 115 | 0.6 | 3.5 | 12 | 15 | present | 2 | decrease | 3.5 | 32 |
| Example 116 | 0.3 | 5.2 | 15 | 25 | present | 4.5 | decrease | 4 | 25 |
| Example 117 | 0.3 | 3.5 | 12 | 28 | present | 3.8 | decrease | 3.2 | 20 |
| Example 118 | 0.3 | — | 12 | 22 | present | 4.8 | decrease | 2.8 | — |
| Example 119 | 0.3 | — | 15 | 18 | present | 2.5 | decrease | 3.5 | — |
| Example 120 | 0.3 | 3.5 | 12 | 25 | present | 2 | decrease | 4.2 | 35 |
| Example 121 | 0.3 | 2.5 | 12 | 28 | present | 3.5 | decrease | 5.5 | 35 |

TABLE 5

| | TiN layer (μm) | TiCN layer (μm) | concentration distribution of C in TiN layer | | | concentration distribution of Co in TiN layer | | | maximum concentration (at %) of C in TiCN layer |
|---|---|---|---|---|---|---|---|---|---|
| | | | difference (at %) | maximum concentration (at %) | local minimum | maximum concentration (at %) | distribution | C/Co | |
| Comparative Example 101 | — | — | — | — | — | — | — | — | — |
| Comparative Example 102 | — | — | — | — | — | — | — | — | — |
| Comparative Example 103 | 0.3 | 4.5 | — | — | — | — | — | — | 32 |
| Comparative Example 104 | 0.3 | 5.2 | — | — | — | — | — | — | 32 |
| Comparative Example 105 | 0.3 | 4.5 | 0 | 15 | absent | 2.5 | decrease | 6 | 32 |
| Comparative Example 106 | 0.3 | 4.5 | 5 | 25 | absent | 2.5 | decrease | 10 | 32 |
| Comparative Example 107 | 0.3 | 4.5 | 0 | 25 | absent | 2.5 | constant | 10 | 35 |

In Table 4, "at %" represents atomic %, "difference" in the concentration distribution of C in the TiN layer refers to a difference between the maximum concentration and the direction and the distribution still includes a region where the concentration of C decreases in the direction from the base material toward the surface of the coating.

Further, in Table 4, regarding the concentration distribution of Co in the TiN layer, "maximum concentration" refers to the maximum concentration of Co in the concentration distribution, "decrease" in the column "distribution" means that the concentration of Co in the concentration distribution of Co continuously decreases in the direction from the base material toward the surface of the coating, and "constant" in the column "distribution" means that the concentration of Co is constant from the base material to the surface of the coating. "C/Co" represents how many times C is as high as Co in atomic ratio, and the numerical value for "C/Co" is the minimum value of the number of times for each TiN layer.

The expressions in Table 5 are basically similar in meaning to those in Table 4. It should be noted, regarding Comparative Examples 103 and 104, although the TiN layer is formed directly on the base material, the TiN layer does not contain C and Co. Regarding Comparative Example 105, although the TiN layer is formed directly on the base material and the TiN layer contains C and Co, this C does not have its concentration distribution (namely the concentration of C is constant in the thickness direction) (the concentration of Co decreases in the direction from the base material toward the surface of the coating). Regarding Comparative Example 106, although the TiN layer is formed directly on the base material and the TiN layer has respective concentration distributions of C and Co, the concentration of C in the concentration distribution continuously increases in the direction from the base material toward the surface of the coating (the concentration of Co decreases in the direction from the base material toward the surface of the coating). Regarding Comparative Example 107, although the TiN layer is formed directly on the base material and the TiN layer contains C and Co, the C and Co do not have their concentration distributions (namely respective concentrations of C and Co are constant in the thickness direction).

<Evaluation>

For the surface-coated cutting tools (indexable inserts for milling and indexable inserts for turning) of the Examples and the Comparative Examples each that were produced as described above, cutting tests of two different types as described below were conducted to thereby made evaluations. The results are shown in Tables 6 and 7 below.

<Cutting Test 101: Evaluation of Wear Resistance in Milling>

An indexable insert for milling was used as the surface-coated cutting tool, cutting was performed under the cutting conditions that the workpiece to be cut was SCM435 (a block of 300 mm in length×200 mm in width), the cutting speed was 300 m/min, the feed rate was 0.25 mm/t, and a cut of 1.5 mm was made without cutting oil, and the wear resistance in milling was evaluated. At the time when cutting had been performed for 15 minutes, the average wear width Vb (mm) of the flank face was measured. The insert having a smaller average wear width Vb has higher wear resistance.

<Cutting Test 102: Evaluation of Wear Resistance in Turning>

An indexable insert for turning was used as the surface-coated cutting tool, cutting was performed under the cutting conditions that the workpiece to be cut was SCM415 (350 mm in diameter×500 mm in length), the cutting speed was 200 m/min, the feed rate was 0.3 mm/t, and a cut of 1.5 mm was made with a water-soluble cutting fluid as the cutting oil, and the wear resistance in turning was evaluated. At the time when cutting had been performed for 30 minutes, the average wear width Vb (mm) of the flank face was measured. The insert having a smaller average wear width Vb has higher wear resistance.

TABLE 6

|  | cutting test 101 Vb (mm) | cutting test 102 Vb (mm) |
|---|---|---|
| Example 101 | 0.087 | 0.115 |
| Example 102 | 0.075 | 0.108 |
| Example 103 | 0.085 | 0.101 |
| Example 104 | 0.088 | 0.118 |
| Example 105 | 0.078 | 0.105 |
| Example 106 | 0.091 | 0.117 |
| Example 107 | 0.095 | 0.119 |
| Example 108 | 0.103 | 0.129 |
| Example 109 | 0.101 | 0.125 |
| Example 110 | 0.105 | 0.122 |

TABLE 7

|  | cutting test 101 Vb (mm) | cutting test 102 Vb (mm) |
|---|---|---|
| Example 111 | 0.121 | 0.133 |
| Example 112 | 0.118 | 0.134 |
| Example 113 | 0.128 | 0.135 |
| Example 114 | 0.135 | 0.142 |
| Example 115 | 0.133 | 0.144 |
| Example 116 | 0.138 | 0.156 |
| Example 117 | 0.136 | 0.157 |
| Example 118 | 0.139 | 0.166 |
| Example 119 | 0.142 | 0.163 |
| Example 120 | 0.162 | 0.175 |
| Example 121 | 0.158 | 0.177 |
| Comparative Example 101 | 0.421 | 0.415 |
| Comparative Example 102 | 0.485 | 0.471 |
| Comparative Example 103 | 0.425 | 0.362 |
| Comparative Example 104 | 0.325 | 0.345 |
| Comparative Example 105 | 0.291 | 0.397 |
| Comparative Example 106 | 0.334 | 0.367 |
| Comparative Example 107 | 0.367 | 0.415 |

As clearly seen from Tables 6 and 7, it has been confirmed that the surface-coated cutting tools of the Examples have improved wear resistance relative to the surface-coated cutting tools of the Comparative Examples and have significantly improved tool life. It has accordingly been confirmed that the surface-coated cutting tool of the present invention is well adaptable to high-speed machining. This is apparently for the reason that the surface-coated cutting tool of the present invention has the characteristics of the present invention to thereby have improved adherence between the base material and the coating.

While the embodiments and examples have herein been described, it has originally been intended to combine characteristics of the above-described embodiments and examples as appropriate.

It should be construed that the embodiments and examples disclosed herein are given by way of illustration in all respects, not by way of limitation. It is intended that the scope of the present invention is defined by claims, not by the description above, and encompasses all modifications and variations equivalent in meaning and scope to the claims.

The invention claimed is:

1. A surface-coated cutting tool comprising a base material and a coating formed on the base material,
said coating including one or two or more layers,
a layer among said layers that abuts on said base material being a TiN layer,
said TiN layer containing at least one element together with TiN,
said element being C, said C having a concentration distribution in a thickness direction of said TiN layer, said concentration distribution including a region where the concentration of said C decreases in a direction from said base material toward a surface of said coating, and said concentration distribution having a difference between a maximum concentration and a minimum concentration of said C of 10 atomic % or more.

2. The surface-coated cutting tool according to claim 1, wherein said C has a maximum concentration of 30 atomic % or less.

3. The surface-coated cutting tool according to claim 1, wherein said concentration distribution has a distribution where the concentration of said C decreases in the direction from said base material, then reaches a local minimum, and thereafter increases in the direction toward the surface of said coating.

4. The surface-coated cutting tool according to claim 1, wherein said TiN layer has a thickness of 0.1 to 0.5 µm.

5. The surface-coated cutting tool according to claim 1, wherein
said coating includes a TiCN layer located directly on said TiN layer,
said TiCN layer contains TiCN, and
C in said TiCN layer has a maximum concentration of 20 atomic % or more.

6. The surface-coated cutting tool according to claim 1, wherein
said coating further includes another layer, and
said another layer is one or more layers made of a compound of at least one element selected from the group consisting of group 4 elements, group 5 elements, and group 6 elements in the periodic table, Al, and Si and at least one element selected from the group consisting of boron, carbon, nitrogen, and oxygen.

7. The surface-coated cutting tool according to claim 1, wherein said coating is formed by chemical vapor deposition.

8. The surface-coated cutting tool according to claim 1, wherein said base material is a cemented carbide.

9. The surface-coated cutting tool according to claim 1, wherein
said base material is made of a cemented carbide,
said TiN layer contains C and Co together with TiN,
said C and said Co each have a concentration distribution in the thickness direction of said TiN layer,
the concentration distribution of said C includes a region where the concentration of said C decreases in the direction from said base material toward the surface of said coating, and
the concentration distribution of said Co includes a region where the concentration of said Co decreases in the direction from said base material toward the surface of said coating.

10. A surface-coated tool comprising a base material and a coating formed on the base material,
said coating including one or two or more layers,
a layer among said layers that abuts on said base material being a TiN layer,
said base material being made of a cemented carbide,
said TiN layer containing C and Co together with TiN,
said C and said Co each having a concentration distribution in a thickness direction of said TiN layer,
the concentration distribution of said C including a region where the concentration of said C decreases in a direction from said base material toward the surface of said coating,
the concentration distribution of said Co including a region where the concentration of said Co decreases in a direction from said base material toward the surface of said coating, and
the concentration distribution of said C having a difference between a maximum concentration and a minimum concentration of said C of 10 atomic % or more.

11. The surface-coated cutting tool according to claim 10, wherein said C and said Co in said TiN layer have an atomic ratio that said C is twice or more as high as said Co.

12. The surface-coated cutting tool according to claim 9, wherein the concentration distribution of said C has a difference between a maximum concentration and a minimum concentration of said C of 10 atomic % or more.

13. The surface-coated cutting tool according to claim 10, wherein
said C has a maximum concentration of 30 atomic % or less, and
said Co has a maximum concentration of 5 atomic % or less.

14. The surface-coated cutting tool according to claim 10, wherein
the concentration distribution of said C has a distribution where the concentration of said C decreases in the direction from said base material, then reaches a local minimum, and thereafter increases in the direction toward the surface of said coating, and
the concentration distribution of said Co has a distribution where the concentration of said Co decreases in the direction from said base material toward the surface of said coating.

15. The surface-coated cutting tool according to claim 10, wherein said TiN layer has a thickness of 0.1 to 0.5 µm.

16. The surface-coated cutting tool according to claim 10, wherein
said coating includes a TiCN layer located directly on said TiN layer,
said TiCN layer contains TiCN, and
C in said TiCN layer has a maximum concentration of 20 atomic % or more.

17. The surface-coated cutting tool according to claim 10, wherein
said coating further includes another layer, and
said another layer is one or more layers made of a compound of at least one element selected from the group consisting of group 4 elements, group 5 elements, and group 6 elements in the periodic table, Al, and Si and at least one element selected from the group consisting of boron, carbon, nitrogen, and oxygen.

18. The surface-coated cutting tool according to claim 10, wherein said coating is formed by chemical vapor deposition.

* * * * *